United States Patent [19]

Lin et al.

[11] Patent Number: 5,033,069

[45] Date of Patent: Jul. 16, 1991

[54] MULTISTATE DEVICE FOR ELECTRONIC COUNTING

[75] Inventors: Hung C. Lin, Silver Spring, Md.; Tai-Haur Kuo, Taipei, Taiwan

[73] Assignee: University of Maryland at College Park, College Park, Md.

[21] Appl. No.: 390,792

[22] Filed: Aug. 8, 1989

[51] Int. Cl.$^5$ ............................................. H03K 29/00
[52] U.S. Cl. ....................................... 377/98; 307/322
[58] Field of Search ........................... 377/98; 307/322

[56] References Cited

U.S. PATENT DOCUMENTS

| | | | |
|---|---|---|---|
| 3,313,956 | 4/1967 | Hillman | 307/322 |
| 3,381,147 | 4/1968 | Abraham | 307/322 |
| 3,569,733 | 3/1971 | Weischedel et al. | 377/126 |
| 3,701,148 | 10/1972 | Frei | 340/825.77 |
| 3,809,925 | 5/1974 | Hertz | 307/361 |

OTHER PUBLICATIONS

Musa et al., "A CMOS Monolithic 3½-Digit A/D Converter", IEEE Int'l Solid-State Circuits Conf. Digest of Tech. Papers, 1976, pp. 144–145.
Peterson, "A Monolithic Video A/D Converter", IEEE Journal of Solid-State Circuits, vol. SC-14, No. 6, Dec. 1979.
Arbel et al., "Fast ADC", IEEE Transactions on Nuclear Science, vol. NS-22, Feb. 1975.
Sollner et al., "Resonant Tunneling Through Quantum Wells at Frequencies Up to 2.5 THz", Appl. Phys. Lett. 43(6), Sep. 15, 1983.
Potter et al., "VB-3 A Vertically Integrated Resonant Tunneling Device With Multiple Negative Differential Resistances", IEEE Transactions on Electron Devices, vol. 35, No. 12, Dec. 1988.
Lakhani et al., "Eleven-Bit Parity Generator with a Single, Vertically Integrated Resonant Tunneling Device", Electronics Letters, May 26, 1988, vol. 24, No. 11.
Smarandoiu et al., "An All-MOS Analog-to-Digital Converter Using a Constant Slope Approach", IEEE J. Solid-State Circuits, vol. SC-11, pp. 408-410, Jun. 1976.
Tan et al., "Series-Connected Tunnel Diode Scaler Design Considerations" Electronic Engineering, Oct. 1967, pp. 624-629.
Samunsenko et al., "Tunnel Diode Register" RCA Technical Notes No. 514, Mar. 1962, 3 sheets.

Primary Examiner—John S. Heyman
Attorney, Agent, or Firm—Martin M. Novack

[57] ABSTRACT

The disclosure is directed to an electronic circuit and method for counting input electrical signals. An embodiment of the method of the invention includes the following steps: providing a device having a current versus voltage characteristic with a plurality of peaks, and negative resistance regions between the peaks; generating a triggering pulse in response to each input signal to be counted, and applying said triggering pulse to the device to change the voltage across the device; and outputting the voltage across the device as an indication of the number of received input signals. The device may be a resonant tunneling diode with multiple peaks in its current versus voltage characteristic. The preferred embodiment of the method of the invention includes the step of providing a load resistance means across the device. In this embodiment, the triggering pulse is operative to change the voltage across the device to a stable operating point of the device in conjunction with the load resistance means. Also in this embodiment, the step of providing a triggering pulse comprises providing a current pulse whose magnitude depends on the present stable operating point of the device in conjunction with the load resistance means. The counting technique and apparatus of the present invention operates at high speed and without undue complexity.

14 Claims, 5 Drawing Sheets

MULTISTATE DEVICE FOR ELECTRONIC COUNTING

BACKGROUND OF THE INVENTION

This invention relates to electronic counting circuits and techniques and, more particularly to an improved apparatus and method for producing an electronic signal indicative of a number of arriving input signals.

Electronic counter circuits and techniques are common in the art, and have numerous applications. However, most conventional counter circuits and techniques suffer one or more of the following disadvantages: slow response time, complexity or expense of design, and unreliable operation.

It is among the objects of the present invention to devise a novel counting circuit and technique based on a new approach which results in a electronic counting circuit and technique that has a fast response, and will operate reliably and with a minimum of complexity.

SUMMARY OF THE INVENTION

The present invention is directed to an electronic circuit and method for counting input electrical signals. An embodiment of the method of the invention includes the following steps: providing a device having a current versus voltage characteristic with a plurality of peaks, and negative resistance regions between the peaks; generating a triggering pulse in response to each input signal to be counted, and applying said triggering pulse to the device to change he voltage across the device; and outputting the voltage across the device as an indication of the number of received input signals. The device may be a resonant tunneling diode with multiple peaks in its current versus voltage characteristic.

The preferred embodiment of the method of the invention includes the step of providing a load resistance means across the device. In this embodiment, the triggering pulse is operative to change the voltage across the device to a stable operating point of the device in conjunction with the load resistance means. Also in this embodiment, the step of providing a triggering pulse comprises providing a current pulse whose magnitude depends on the present stable operating point of the device in conjunction with the load resistance means. The preferred embodiment of the invention further includes the step of providing a reset signal for resetting the stable operating point of the device to its lowest voltage stable operating point upon occurrence of the next input signal after the device is at its highest voltage stable operating point.

The counting technique and apparatus of the present invention operates at high speed and without undue complexity.

Further features and advantages of the invention will become more readily apparent from the following detailed description when taken in conjunction with the accompanying drawings.

DESCRIPTION OF THE PREFERRED EMBODIMENT

Figure 1:
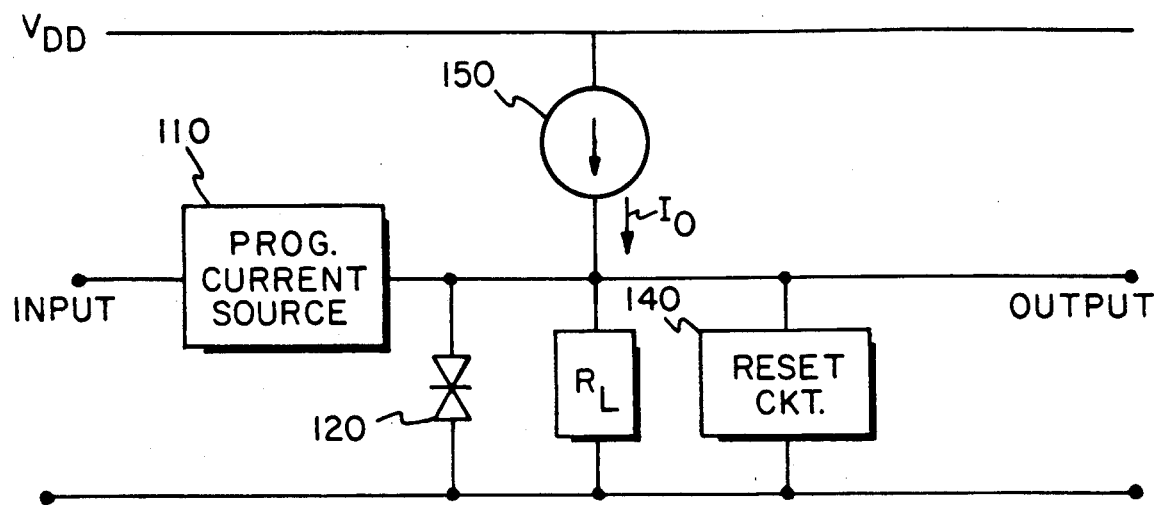
FIG. 1 is a schematic diagram, partially in block form, of an apparatus in accordance with an embodiment of the invention and which can be used to practice an embodiment of the method of the invention.

Referring to FIG. 1, there is shown a counter in accordance with an embodiment of the invention, and which can be used to practice the method of the invention. Input signals to be counted are received by a programmable current source 110. The output of the programmable current source 110 is coupled to a resonant tunneling diode (RTD) 120. A load resistance $R_L$ and a reset circuit 140 are coupled in parallel with the RTD 120. A constant current source 150, coupled from a rail 155 which is held at a voltage $V_{DD}$, provides a current $I_0$ to the parallel combination of RTD 120, load $R_L$, and reset circuit 140.

Figure 2:
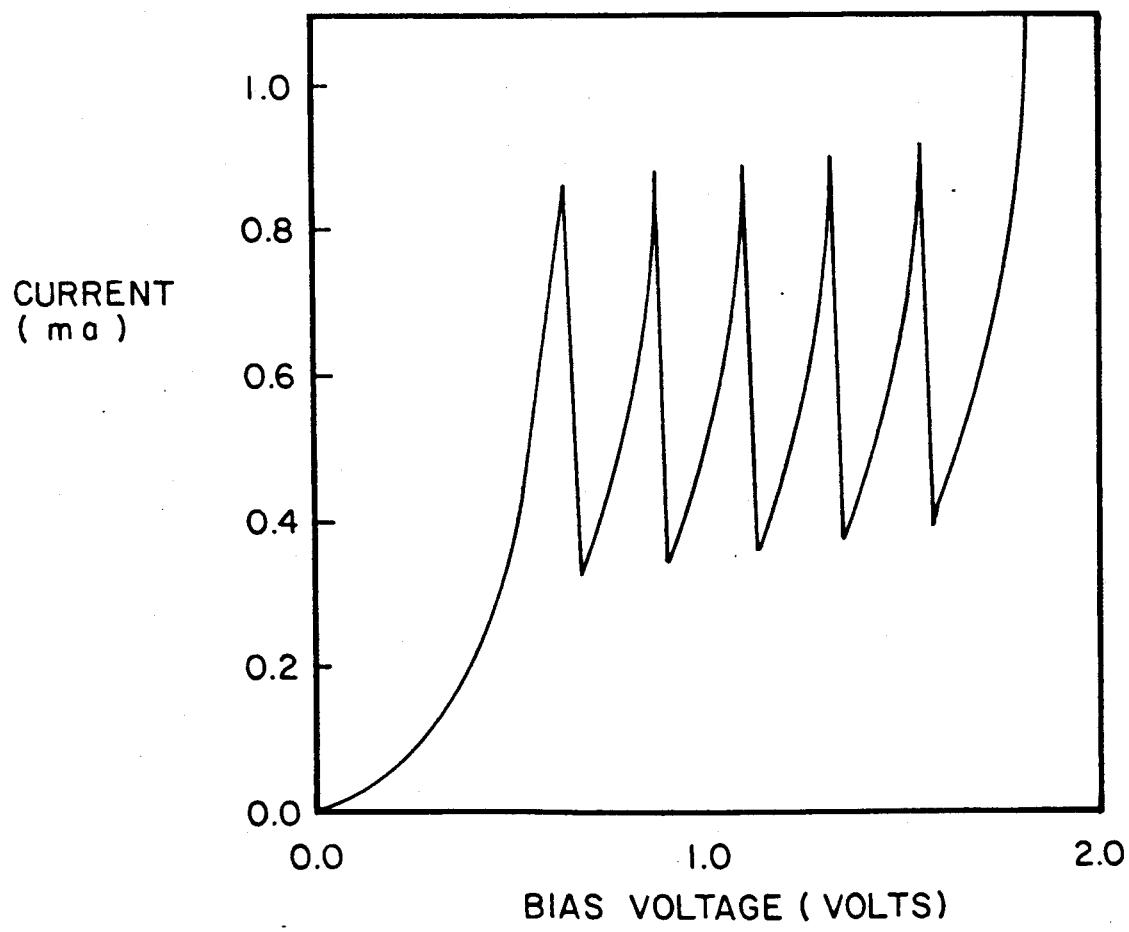
FIG. 2 illustrates the current vs. voltage characteristic of a five quantum well resonant tunneling device.

FIG. 2 shows the current vs. voltage (I-V) characteristic of a five quantum well RTD device. The illustrated characteristic is seen to have five substantially symmetrical peaks in its I-V characteristic. As is known, by varying the thickness of the barrier and spacer layers, one can tailor the peak-to-peak voltage, the peak-to-valley ratio, and the peak current of the RTD. The number of peaks can be determined, for example, by the number of superlattice groups repeated in the device. [For description of the fabrication and electrical characteristics of a multi-well InGaAs/InAlAs RTD, reference can be made, for example, to A. Lakhani et al., "Eleven-Bit Parity Generator With A Single, Vertically Integrated Resonant Tunneling Device", Electron Lett., 24, 681–683 (1988), and R. Potter et al., "A Vertically integrated Resonant Tunneling Device With Multiple Negative Differential Resistances", Device Research Conference, Boulder, Colo. (1988).]

Figure 3:
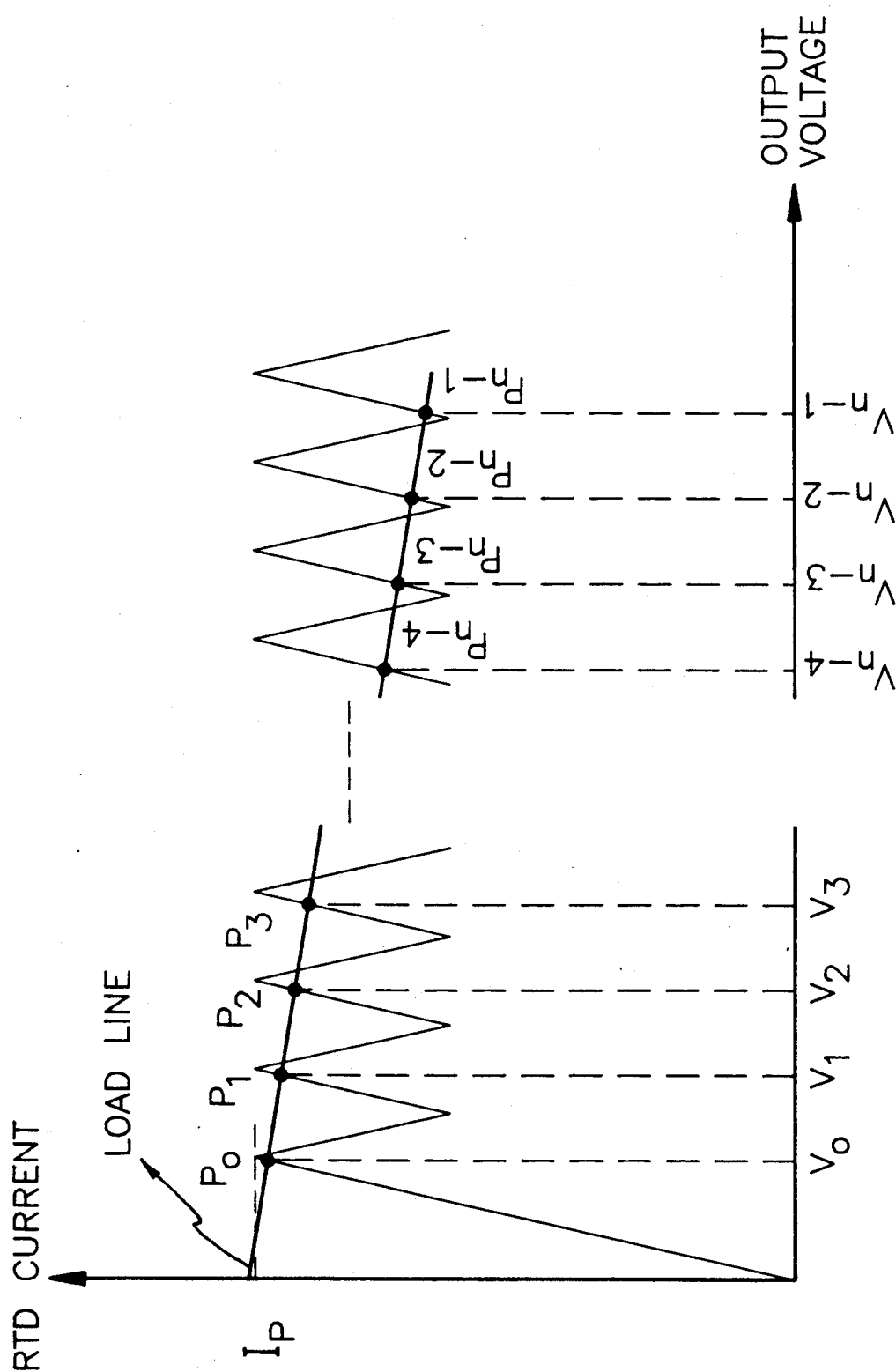
FIG. 3 illustrates an example of the current vs. voltage for the resonant tunneling diode of the FIG. 1 embodiment, and an operating load line and stable operating points of the circuit.

The load shown in FIG. 1 is chosen to obtain stable operating points $P_0, P_1, \ldots P_{n-1}$ on the load line illustrated in FIG. 3. Each such point represents a different voltage across the RTD 120 (which has n peaks in this example), and therefore a different state of a multiple-valued system. However, the total current which flows through the RTD 120 and $R_L$ are nearly the same for different stable operating points.

Figure 4:
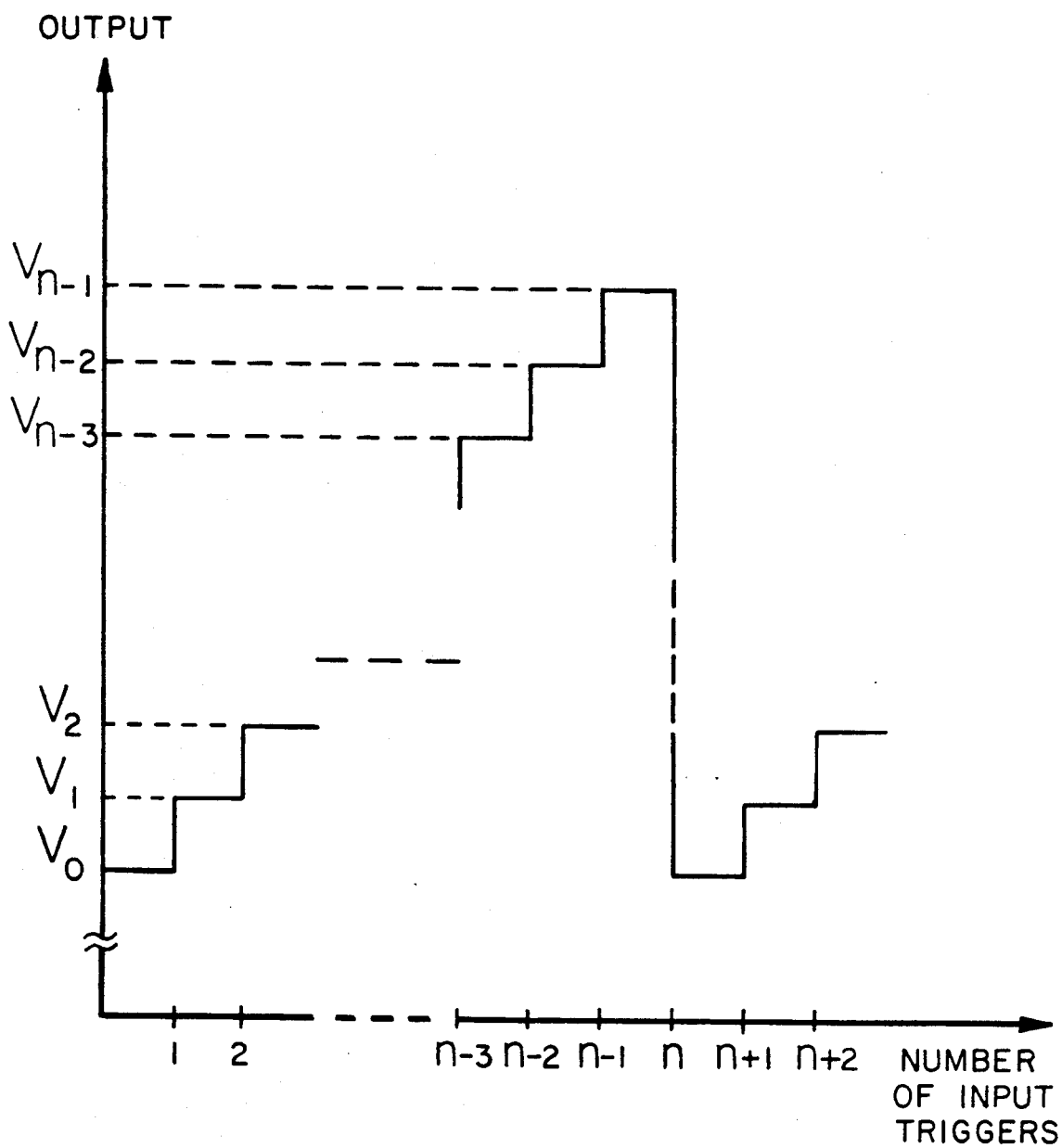
FIG. 4 is a graph showing the relationship between the number of input signals and the output voltage of the FIG. 1 embodiment.

Assume that the voltage and current are at a particular stable operating point (FIG. 3). When an input signal is detected, the programmable current source 110 adds additional current to surmount the next peak to the right, and the next stable operating point will be attained [except in the case of the highest voltage operating point $P_{n-1}$, which will be reset to the lowest voltage operating point, $P_1$, by the reset circuit 140, as will be described hereinbelow]. FIG. 4 shows the relationship between the number of input signals and the output voltage of the FIG. 1 circuit, and it is seen that for n stable operating points the circuit operates as count-to-n counter. [Since the counter can also be used to divide by n, it will be understood that references herein to a counter are also intended to generically include a divider.]

Figure 5A:
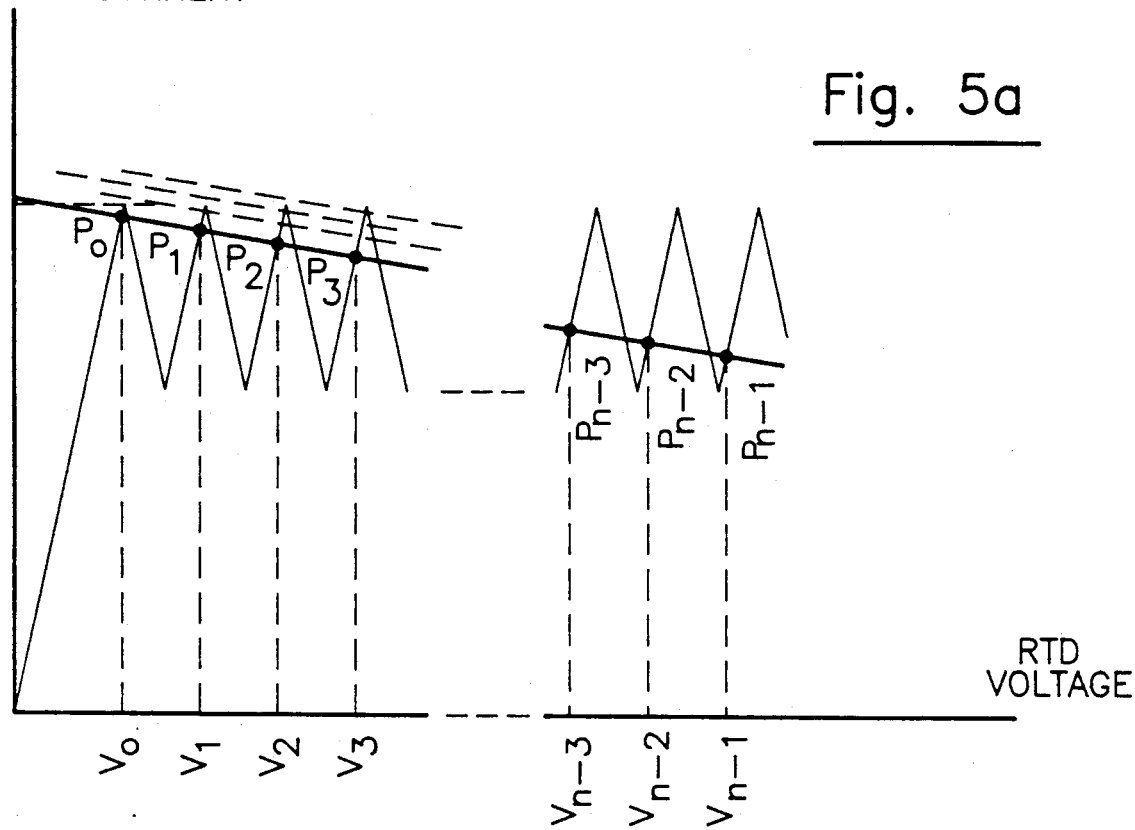
FIG. 5a and FIG. 5b illustrates the required trigger current for an example of the FIG. 1 embodiment.
Figure 5B:
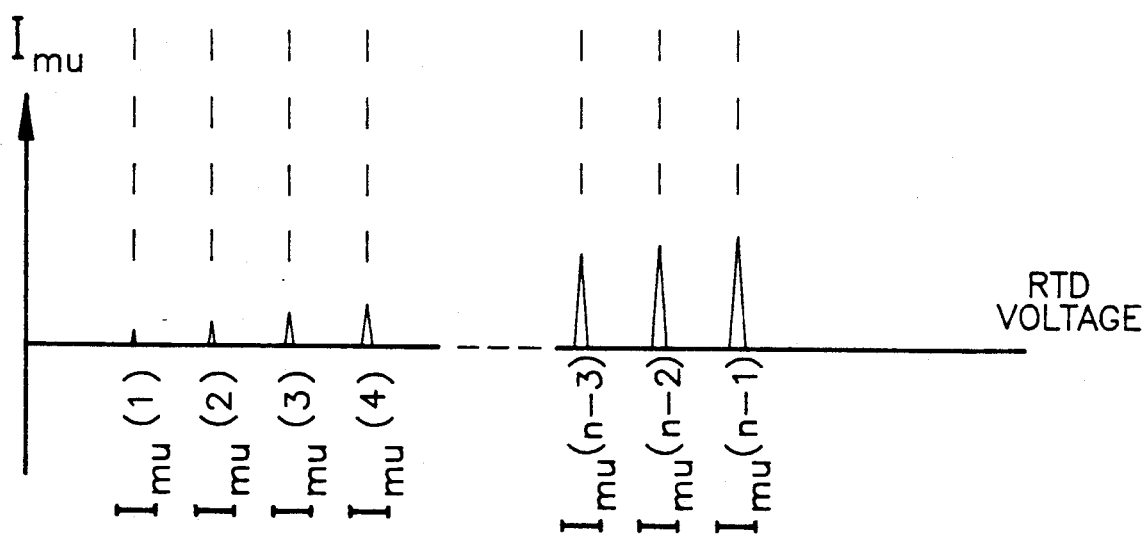

To push one state, $V_m$, to the next state, $V_{m+1}$, the required trigger current, $I_{mu(m+1)}$, is different for different operating points. This is shown in FIGS. 5a and 5b. The diode current levels at successive stable operating points are progressively lower toward the last operating point, and since the I-V peaks are about the same height, the required trigger currents, $I_{mu}$, are progressively higher. This is illustrated in FIG. 5b.

Figure 6:
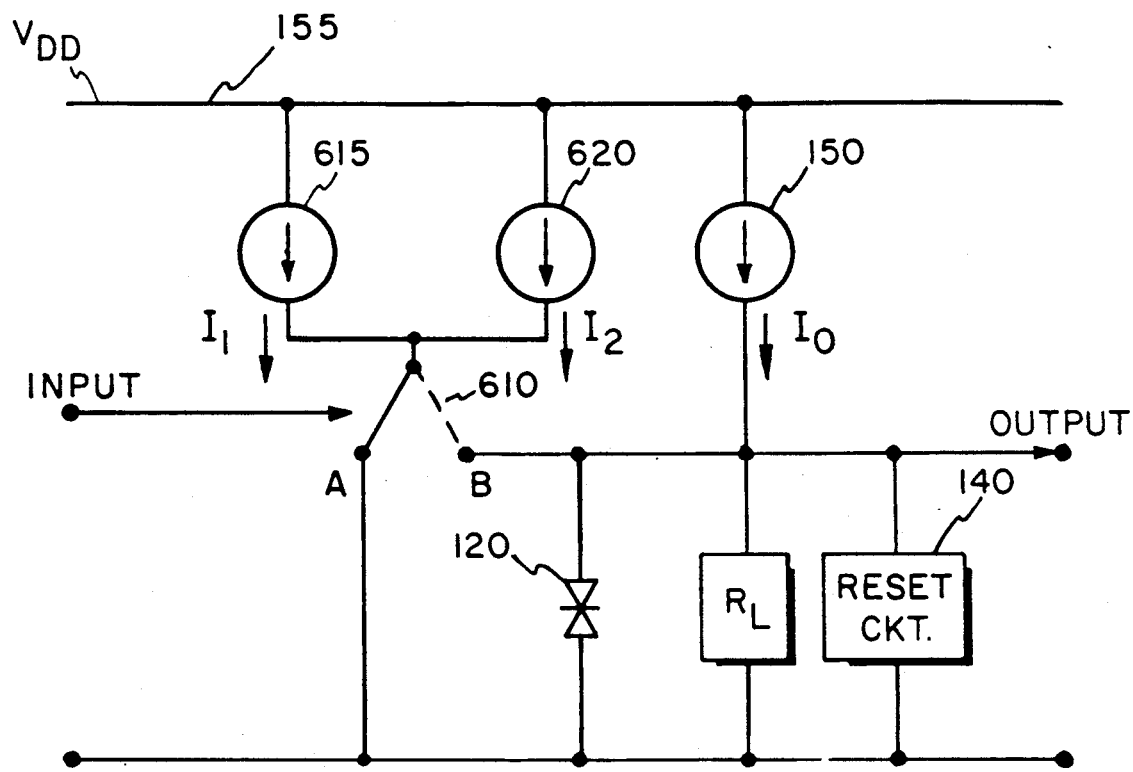
FIG. 6 is a schematic diagram, partially in block form, which illustrates an embodiment of the programmable current source of the FIG. 1 embodiment.

FIG. 6 shows an example of a programmable current source which provides suitable current for attaining the next operating point. A switch 610 is switched, by input signals to be counted, e.g. input pulses, from an inoperative terminal A to a terminal B that is coupled to the RTD 120. Two current sources, 615 and 620, which respectively produce currents $I_1$ and $I_2$, are coupled from rail 155 to switch 610, and are coupled to the RTD circuit when the switch is coupled to terminal B. $I_1$ is a constant current, and $I_2$ provides a current $kI_L$, where k is a constant, and $I_L$ is the current through load resistor $R_L$. Thus, the total current provided by the programmable current source 110 will depend on the load current, $I_L$, which, in turn, depends on the present operating point. [As noted above, the total current through the load resistor and the RTD stays approximately constant. Therefore, as the current through the RTD decreases, the current through the load resistor will increase.] When the input pulse is removed, the switch 610 returns to position A. In this manner, the circuit of FIG. 6 can provide the pulse train shown in FIG. 5b in response to a sequence of input signals.

Figure 7:
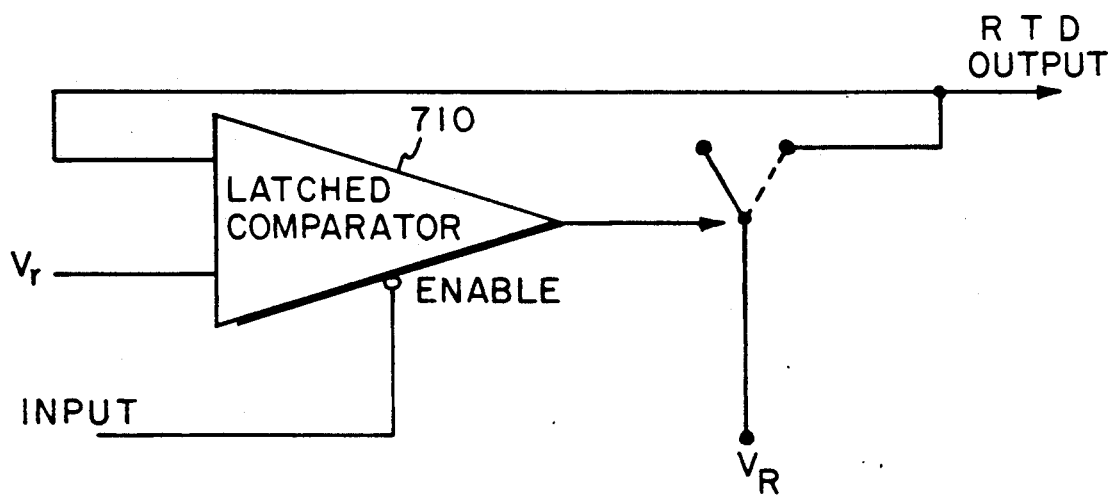
FIG. 7 is a schematic diagram, partially in block form, which illustrates an embodiment of the reset circuit of the FIG. 1 embodiment.

An example of a reset circuit 140 (FIG. 1) is shown in FIG. 7. A latched comparator 710 is provided, and one of the inputs thereto is a voltage $V_r$, which is selected to be a voltage between the voltage of the highest stable operating point (e.g. $P_{n-1}$ of FIG. 3) and the voltage of the next highest stable operating point (e.g. $P_{n-2}$ of FIG. 3). The other input to latched comparator 710 is the RTD output line. The input to the counter (e.g. FIG. 1) is coupled to the enable terminal of the latched comparator 710, so that it will produce an output in response to the leading edge of an input pulse. The output of latched comparator 710 is coupled to the control terminal of a switch 720 which, when closed in response to an output signal from the latched comparator 710, couples the RTD output to a potential $V_R$ that is less than the voltage $V_O$ of the lowest state operating point at the beginning of the next input.

The invention has been described with reference to a particular preferred embodiment, but variations within the spirit and scope of the invention will occur to those skilled in the art. For example, it will be understood that voltage triggering can be utilized instead of current triggering to change the operating point. Also, by applying suitable negative current or voltage, the counter can be made to count down (by moving to a lower operating point) as well as up. Further, it will be understood that counters of the type shown can be connected in series to obtain various types of counters or dividers.

We claim:

1. A method for counting input electrical signals, comprising the steps of:
   providing a device having a current versus voltage characteristic with a plurality of peaks, and negative resistance regions between the peaks;
   providing a load resistance means across said device so that a plurality of progressively lower stable current operating states are effected with increasing voltage on said plural peak characteristic;
   generating a triggering current pulse in response to each input signal to be counted, and applying said triggering pulse to said device to change the voltage across said device, said triggering pulse being operative to change the voltage across said device to a further stable operating state of said device on said characteristic in conjunction with said load resistance means, the magnitudes of said triggering pulses progressively increasing and being dependent on the present stable operating state of said device in conjunction with said load resistance means; and
   outputting the voltage across said device as an indication of the number of received input signals.

2. The method as defined by claim 1, further comprising providing a reset signal for resetting the stable operating point of the device to its lowest voltage stable operating point upon occurrence of the next input signal after said device is at its highest voltage stable operating point.

3. The method as defined by claim 1, wherein said plurality of peaks comprises multiple peaks.

4. The method as defined by claim 2, wherein said plurality of peaks comprises multiple peaks.

5. The method as defined by claim 1, wherein said device is a resonant tunneling diode.

6. The method as defined by claim 4, wherein said device is a resonant tunneling diode.

7. The method as defined by claim 1, wherein said step of generating a triggering current pulse comprises generating a pulse having a magnitude that is proportional to the current through said load resistance means at said present stable operating point.

8. Apparatus for counting input electrical signals, comprising:
   a device having a current versus voltage characteristic with a plurality of peaks, and negative resistance regions between said peaks;
   load resistance means coupled across said device providing progressively lower stable current operating states with increasing voltage on said plural peak characteristic; and
   current pulse generating means responsive to a received input signal for applying a current pulse to said device which has a progressively increasing magnitude that depends on the present stable operating state of said device on said characteristic in conjunction with said load resistance means to effect switching from one stable state to another stable state;
   whereby the voltage across said device is indicative of the number of received input signals.

9. Apparatus as defined by claim 8, further comprising reset circuit means for generating a reset signal for resetting the stable operating point of the device to its lowest voltage stable operating point upon occurrence of the next input signal after said device is at its highest voltage stable operating point.

10. Apparatus as defined by claim 8, wherein said plurality of peaks comprises multiple peaks.

11. Apparatus as defined by claim 9, wherein said plurality of peaks comprises multiple peaks.

12. Apparatus as described by claim 8, wherein said device comprises a resonant tunneling diode.

13. Apparatus as described by claim 11, wherein said device comprises a resonant tunneling diode.

14. Apparatus as defined by claim 8, wherein said current pulse generating means includes means for generating said current pulse having a magnitude that is proportional to the current through said load resistance means at the present stable operating point.

* * * * *